(12) United States Patent
Kawai

(10) Patent No.: US 10,057,977 B2
(45) Date of Patent: Aug. 21, 2018

(54) WIRING BOARD AND ELECTRONIC DEVICE

(71) Applicant: FUJITSU LIMITED, Kawasaki-shi, Kanagawa (JP)

(72) Inventor: Kenichi Kawai, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/465,150

(22) Filed: Mar. 21, 2017

(65) Prior Publication Data

US 2017/0318667 A1 Nov. 2, 2017

(30) Foreign Application Priority Data

Apr. 28, 2016 (JP) .................................. 2016-091756

(51) Int. Cl.
*H05K 1/02* (2006.01)
*H04B 3/32* (2006.01)
(Continued)

(52) U.S. Cl.
CPC ............. *H05K 1/0245* (2013.01); *H04B 1/16* (2013.01); *H04B 3/32* (2013.01); *H04B 2001/305* (2013.01)

(58) Field of Classification Search
CPC .......... G01R 12/04; G01R 31/26; G11C 5/06; G11C 7/10; G11C 11/16; H01P 3/08; H03K 5/00; H03K 5/24; H04B 1/16; H04B 1/30; H04B 3/06; H04B 3/32; H04B 15/00; H04L 25/08; H04L 27/36; H04L 27/38; H05K 1/00; H05K 1/02; H05K 1/11; H05K 1/14; H05K 1/16; H05K 1/18; H05K 1/0228; H05K 1/0245; H05K 7/02; H05K 7/06; H05K 9/00
(Continued)

(56) References Cited

U.S. PATENT DOCUMENTS 7,580,240 B2 * 8/2009 Yamamoto ............. H01G 4/232
361/306.1
7,679,005 B2 * 3/2010 Chan ...................... G06K 7/084
174/262

(Continued)

FOREIGN PATENT DOCUMENTS

| JP | 10-229256 | 8/1998 |
| JP | 2009-141217 | 6/2009 |
| JP | 2010-212439 | 9/2010 |

*Primary Examiner* — Shawkat M Ali
(74) *Attorney, Agent, or Firm* — Oblon, McClelland, Maier & Neustadt, L.L.P.

(57) ABSTRACT

A wiring board includes a first wire, a second wire, a third wire and a fourth wire formed over a substrate and extending in a first direction respectively, the second wire being adjacent to the first wire in the first direction, and the third wire being adjacent to the first wire in a second direction orthogonal to the first direction, and the fourth wire being adjacent to the second wire in the second direction, a pair of fifth wires, a pair of sixth wires, a pair of seventh wires and a pair of eighth wires formed in the substrate and extending in the second direction respectively, a pair of ninth signal vias, a pair of tenth signal vias, a pair of eleventh signal vias and a pair of twelfth signal vias formed in the substrate and extending in a third direction orthogonal to a surface of the substrate respectively.

20 Claims, 15 Drawing Sheets

(51) Int. Cl.
*H04B 1/16* (2006.01)
*H04B 1/30* (2006.01)

(58) Field of Classification Search
USPC ........ 327/77, 87, 89; 361/56, 303, 311, 748,
361/777, 792; 375/219, 295–297, 316
See application file for complete search history.

(56) References Cited

U.S. PATENT DOCUMENTS

| | | | |
|---|---|---|---|
| 2006/0087337 A1* | 4/2006 | Parker | G01R 31/2818 324/754.03 |
| 2008/0099238 A1* | 5/2008 | Djordjevic | H05K 1/0237 174/350 |
| 2009/0147489 A1 | 6/2009 | Togashi | |
| 2011/0305060 A1* | 12/2011 | Ichimura | G11C 5/063 365/63 |
| 2012/0057261 A1* | 3/2012 | Poulton | H04B 3/54 361/56 |
| 2014/0016404 A1* | 1/2014 | Kim | G11C 11/165 365/158 |
| 2015/0055307 A1* | 2/2015 | Shaw | H05K 1/0253 361/748 |
| 2017/0098662 A1* | 4/2017 | Sunamura | H01L 23/5226 |
| 2017/0303391 A1* | 10/2017 | Miyasaka | H05K 1/0245 |

\* cited by examiner

WIRING BOARD AND ELECTRONIC DEVICE

CROSS-REFERENCE TO RELATED APPLICATION

This application is based upon and claims the benefit of priority of the prior Japanese Patent Application No. 2016-091756, filed on Apr. 28, 2016, the entire contents of which are incorporated herein by reference.

FIELD

The technology disclosed herein is related to a wiring board and an electronic device.

BACKGROUND

As a technology related to a wiring board on which a plurality of wiring layers are laminated, the following technology is known. For example, there is known a wiring board in which, with respect to a first layer pattern located above a first insulating layer that constitutes a hybrid IC, a second layer pattern located below the first insulating layer is arranged so as to minimize overlapping between the first layer pattern and the second layer pattern. In this wiring board, the first layer pattern is an assembly of lands for mounting of electric components, and has a wide margin. The second layer pattern passes through portions immediately below the electric components, and is routed to other portions of the margin.

Further, there is known a wiring board in which power supply via holes coupled to a power supply conductive layer and ground via holes coupled to a ground conductive layer are alternately arranged side by side in a row direction and a column direction. On this wiring board, a plurality of capacitors coupled to the power supply via holes and the ground via holes are mounted.

Further, there is known a wiring board in which guard patterns coupled to a ground layer are arranged near pairs of signal wires. Japanese Laid-open Patent Publication No. 10-229256, Japanese Laid-open Patent Publication No. 2009-141217, and Japanese Laid-open Patent Publication No. 2010-212439 are given as related-art documents.

SUMMARY

According to an aspect of the invention, a wiring board includes a first wire, a second wire, a third wire and a fourth wire formed over a substrate and extending in a first direction respectively, the second wire being adjacent to the first wire in the first direction, and the third wire being adjacent to the first wire in a second direction orthogonal to the first direction, and the fourth wire being adjacent to the second wire in the second direction, a pair of fifth wires, a pair of sixth wires, a pair of seventh wires and a pair of eighth wires formed in the substrate and extending in the second direction respectively, a pair of ninth wires, a pair of tenth wires, a pair of eleventh wires and a pair of twelfth wires formed in the substrate and extending in a third direction orthogonal to a surface of the substrate respectively, wherein the pair of ninth wires couple a first end and a second end of the first wire to the pair of fifth wires, respectively, the pair of tenth wires couple a first end and a second end of the second wire to the pair of sixth wires, respectively, the pair of eleventh wires couple a first end and a second end of the third wire to the pair of seventh wires, respectively, and the pair of twelfth wires couple a first end and a second end of the fourth wire to the pair of eighth wires, respectively.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
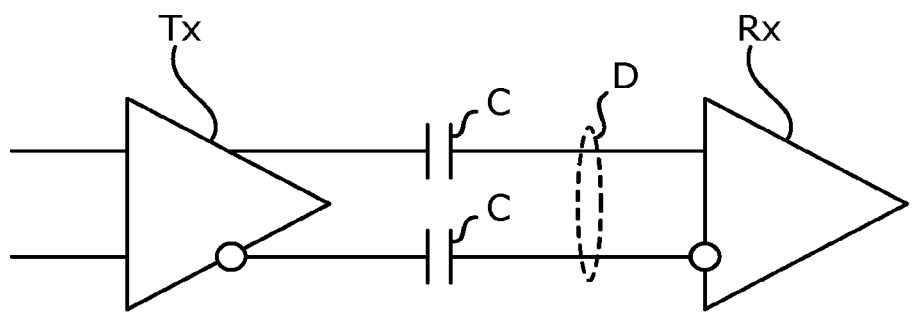
FIG. 1 is a diagram illustrating an example of the configuration of a system including a transmission circuit and a reception circuit Rx configured to transmit signals via a pair of differential transmission lines.

For example, as illustrated in FIG. 1, in a system including a transmission circuit Tx and a reception circuit Rx configured to transmit signals via a pair of differential transmission lines D, capacitors C are provided on the differential transmission lines D in order to remove direct-current components that are present in the differential transmission lines D.

Figure 2:
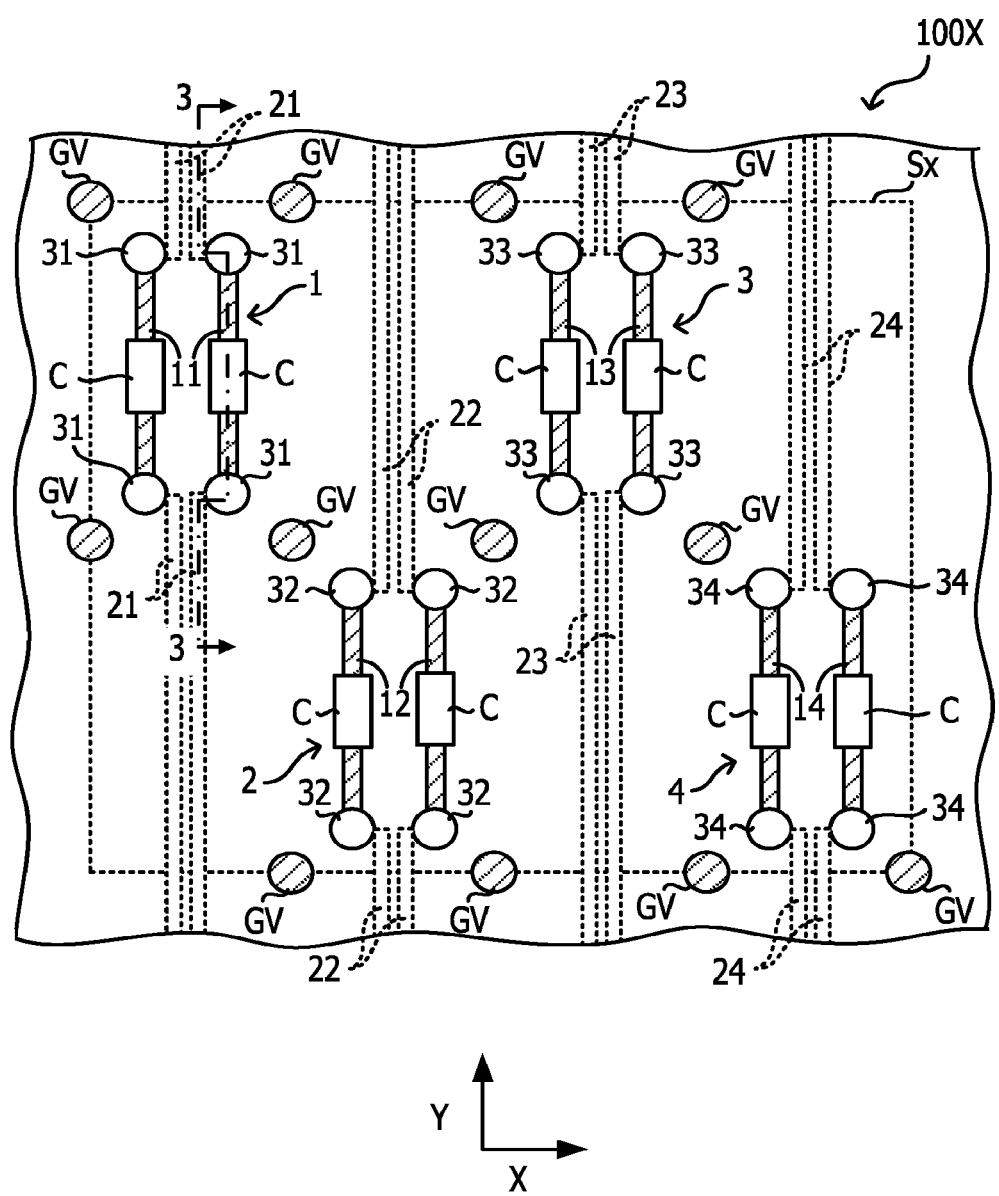
FIG. 2 is a plan view illustrating an example of the configuration of a wiring board having capacitors mounted on the differential transmission lines.
Figure 3:
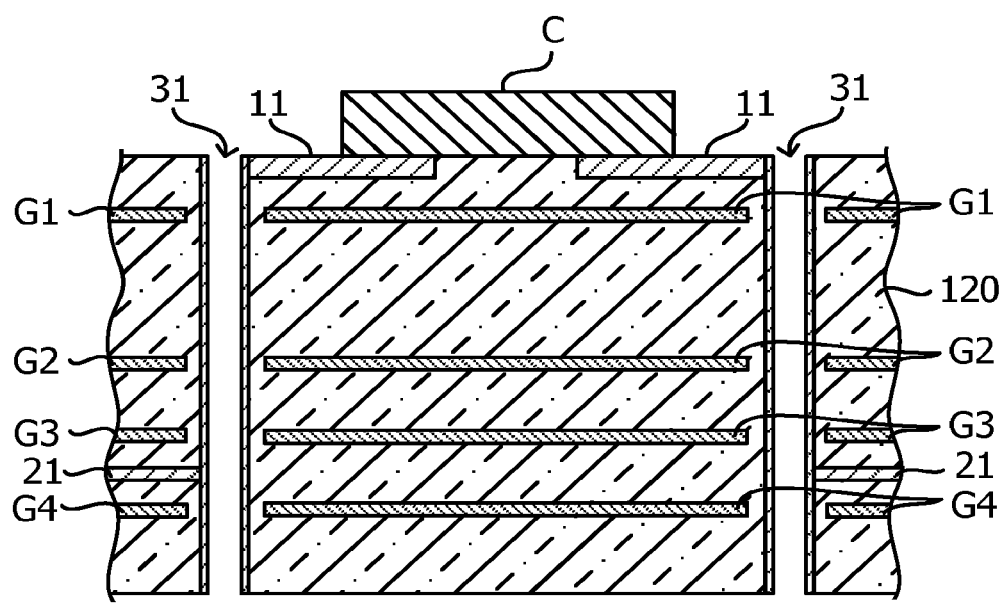
FIG. 3 is a sectional view taken along the line 3-3 in FIG. 2.

FIG. 2 is a plan view illustrating an example of the configuration of a wiring board 100X having capacitors mounted on differential transmission lines. FIG. 3 is a sectional view taken along the line 3-3 in FIG. 2. FIG. 2 illustrates four pairs of differential transmission lines 1, 2, 3, and 4 as an example.

The differential transmission lines 1 include a pair of surface-layer wires 11, a pair of inner-layer wires 21, and a plurality of signal vias 31. The differential transmission lines 2, 3, and 4 have similar configurations to that of the differential transmission lines 1, and include pairs of surface-layer wires 12, 13, and 14, pairs of inner-layer wires 22, 23, and 24, and pluralities of signal vias 32, 33, and 34, respectively. The configuration of the differential transmission lines 1 is described below, and description of the configurations of the differential transmission lines 2 to 4 is therefore omitted.

The pair of surface-layer wires 11 is formed on the surface of a substrate 120 that is constituted by an insulator such as a glass-epoxy resin. The capacitors C are mounted on the pair of surface-layer wires 11, respectively. The signal vias 31 are provided at one end and the other end of the surface-layer wire 11. The signal via 31 includes a through hole that penetrates the substrate 120, and a conductor that covers the inner wall of the through hole and is electrically coupled to the surface-layer wire 11. The pair of inner-layer wires 21 extends inside the substrate 120, and is electrically coupled to the surface-layer wires 11 via the signal vias 31.

Ground vias GV to which ground potentials are applied are provided around the surface-layer wires 11. Each ground via GV includes a through hole that penetrates the substrate 120, and a conductor that covers the inner wall of the through hole. Inside the substrate 120, ground planes G1 to G4 that are electrically coupled to each other via the ground vias GV are laminated while the insulators that constitute the substrate 120 are interposed therebetween. In the example illustrated in FIG. 3, the inner-layer wire 21 is provided in a wiring layer between the ground plane G3 and the ground plane G4.

In the example illustrated in FIG. 2, the surface-layer wires 11 to 14 and the inner-layer wires 21 to 24 each extend in a Y direction of FIG. 2, and the differential transmission lines 1 to 4 are arranged side by side in an X direction of FIG. 2. Further, the surface-layer wires 12 and the signal vias 32 that constitute the differential transmission lines 2 are arranged while being shifted downward in the Y direction from the surface-layer wires 11 and the signal vias 31 that constitute the adjacent differential transmission lines 1 and the surface-layer wires 13 and the signal vias 33 that constitute the adjacent differential transmission lines 3. Similarly, the surface-layer wires 14 and the signal vias 34 that constitute the differential transmission lines 4 are arranged while being shifted downward in the Y direction from the surface-layer wires 13 and the signal vias 33 that constitute the adjacent differential transmission lines 3. By arranging the surface-layer wires and the signal vias that constitute the differential transmission lines in a staggered pattern as described above, crosstalk between the adjacent differential transmission lines may be suppressed. Moreover, by arranging the ground vias GV between the signal via 31 and the signal via 32, between the signal via 32 and the signal via 33, and between the signal via 33 and the signal via 34 as illustrated in FIG. 2, respectively, the advantage of suppressing crosstalk may further be enhanced.

When the surface-layer wires and the signal vias that constitute the differential transmission lines are arranged in a staggered pattern as illustrated in FIG. 2, however, it is desirable to secure a space for arrangement of the surface-layer wires and the signal vias (region Sx surrounded by the broken line in FIG. 2). Further, other inner-layer wires (for example, a wire for transmission of clock signals) to be used together with the differential transmission lines 1 to 4 may desirably be formed along the same direction as the direction in which the inner-layer wires 21 to 24 extend (Y direction in the example illustrated in FIG. 2). In this case, in the configuration of the wiring board 100X illustrated in FIG. 2, it is desirable to avoid interference of the signal vias 31 to 34 and the ground vias GV with the above-mentioned other inner-layer wires. Therefore, it is difficult to design the wires so that the above-mentioned other inner-layer wires pass through the region Sx. Thus, it is desirable to arrange the above-mentioned other inner-layer wires so as to bypass the region Sx. For those reasons, the degree of freedom of wire design may be decreased in the configuration of the wiring board 100X.

Examples of embodiments of the disclosed technology are described below with reference to the drawings. Note that, in the drawings, the same or equivalent components and parts are denoted by the same reference symbols.

First Embodiment

Figure 4:
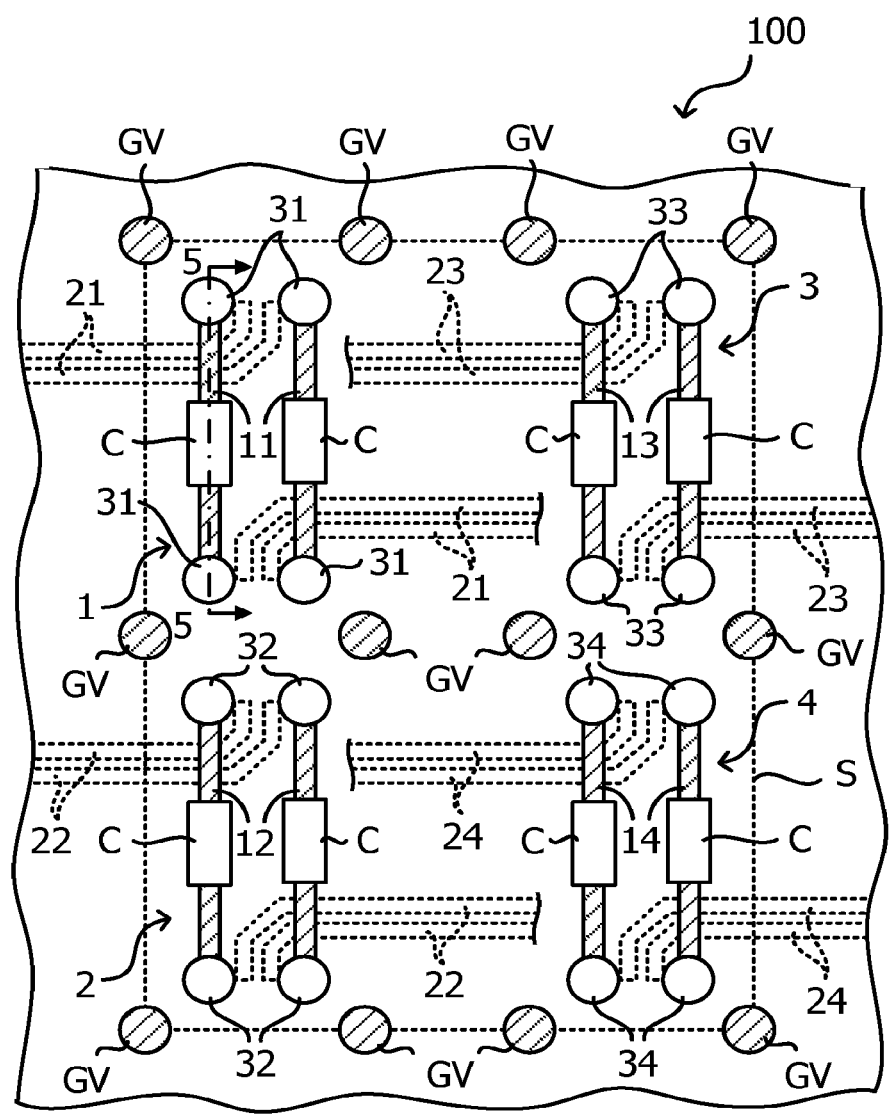
FIG. 4 is a plan view illustrating the configuration of a wiring board according to an embodiment of the disclosed technology.
Figure 4:
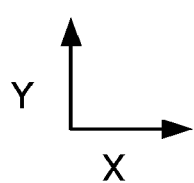
Figure 5:
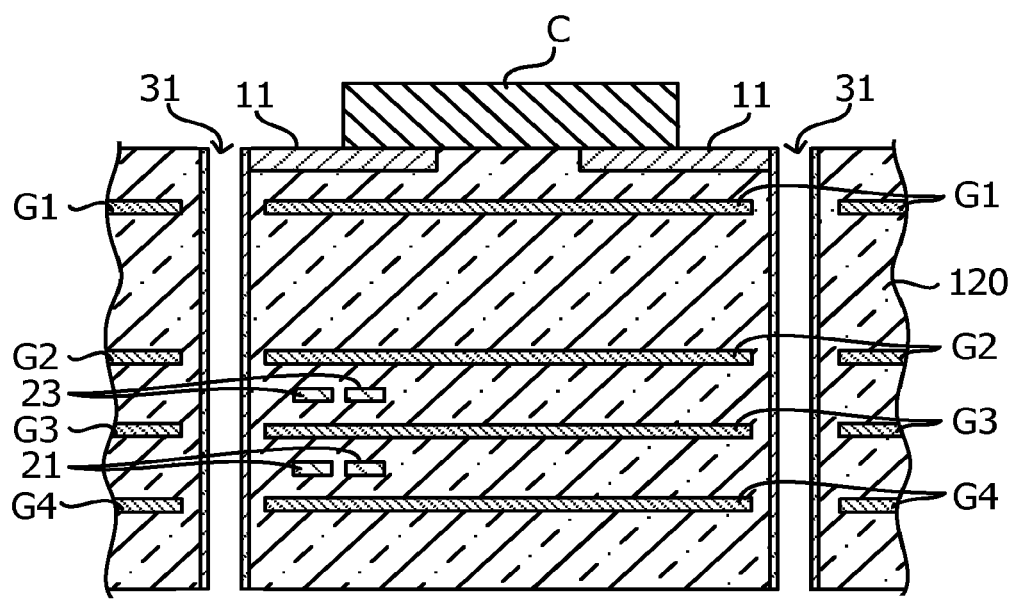
FIG. 5 is a sectional view taken along the line 5-5 in FIG. 4.

FIG. 4 is a plan view illustrating the configuration of a wiring board 100 according to a first embodiment of the disclosed technology. FIG. 5 is a sectional view taken along the line 5-5 in FIG. 4. FIG. 4 illustrates four pairs of differential transmission lines 1, 2, 3, and 4 as an example.

The differential transmission lines 1 include a pair of surface-layer wires 11, a pair of inner-layer wires 21, and a plurality of signal vias 31. The differential transmission lines 2, 3, and 4 have similar configurations to that of the differential transmission lines 1, and include pairs of surface-layer wires 12, 13, and 14, pairs of inner-layer wires 22, 23, and 24, and pluralities of signal vias 32, 33, and 34, respectively. The configuration of the differential transmission lines 1 is described below, and description of the configurations of the differential transmission lines 2 to 4 is therefore omitted.

The surface-layer wires 11 are formed on the surface of a substrate 120 that is constituted by an insulator such as a glass-epoxy resin. The surface-layer wires 11 extend in a Y direction of FIG. 4. A capacitor C is mounted at the center of each surface-layer wire 11. The capacitor C is an electronic component in the form of a so-called chip capacitor. In the surface-layer wire 11, a portion coupled to one electrode of the capacitor C and a portion coupled to the other electrode of the capacitor C are separated from each other. Note that, in the surface-layer wire 11, land patterns may be formed at the portions coupled to the respective electrodes of the capacitor C. The signal vias 31 are provided at one end and the other end of each surface-layer wire 11, respectively. The signal via 31 includes a through hole that penetrates the substrate 120, and a conductor that covers the inner wall of the through hole and is electrically coupled to the surface-layer wire 11.

The inner-layer wires 21 extend inside the substrate 120, and are electrically coupled to the surface-layer wires 11 via the signal vias 31. The inner-layer wires 21 extend in an X direction orthogonal to the Y direction in FIG. 4. That is, the inner-layer wires 21 extend in a direction intersecting the direction in which the surface-layer wires 11 extend. More specifically, the inner-layer wire 21 is led out in the Y direction from a portion coupled to the signal via 31 toward the center of the surface-layer wire 11 (toward the capacitor C), and then bent in the X direction at 90° to extend away from the surface-layer wire 11 while passing through the lower side of the surface-layer wire 11. By leading out the inner-layer wire 21 toward the inner side of the surface-layer wire 11 and bending the inner-layer wire 21 as described above, the region in which the inner-layer wire is formed may be made compact. In this embodiment, the inner-layer wires 21 coupled to the signal vias 31 located at the upper ends of the surface-layer wires 11 extend leftward in the X direction, and the inner-layer wires 21 coupled to the signal vias 31 located at the lower ends of the surface-layer wires 11 extend rightward in the X direction.

The surface-layer wires 12 of the differential transmission lines 2 adjoin the surface-layer wires 11 of the differential transmission lines 1 in the Y direction, and extend in the Y direction. In other words, the surface-layer wires 12 are provided on extension lines of the surface-layer wires 11, and the respective signal vias 32 provided at both ends of the surface-layer wires 12 are positionally aligned in the X direction with the corresponding signal vias 31 of the differential transmission lines 1.

The surface-layer wires 13 of the differential transmission lines 3 adjoin the surface-layer wires 11 of the differential transmission lines 1 in the X direction, and extend in the Y direction. The respective signal vias 33 provided at both ends of the surface-layer wires 13 are positionally aligned in the Y direction with the corresponding signal vias 31 of the differential transmission lines 1.

The surface-layer wires 14 of the differential transmission lines 4 adjoin the surface-layer wires 13 of the differential transmission lines 3 in the Y direction, also adjoin the surface-layer wires 12 of the differential transmission lines 2 in the X direction, and extend in the Y direction. The surface-layer wires 14 are provided on extension lines of the surface-layer wires 13. The respective signal vias 34 provided at both ends of the surface-layer wires 14 are positionally aligned in the Y direction with the corresponding signal vias 32 of the differential transmission lines 2, and are positionally aligned in the X direction with the corresponding signal vias 33 of the differential transmission lines 3.

A plurality of ground vias GV to which ground potentials are applied are provided around the surface-layer wires 11, 12, 13, and 14. Each ground via GV includes a through hole that penetrates the substrate 120, and a conductor that covers the inner wall of the through hole. Inside the substrate 120, ground planes G1 to G4 that are constituted by conductors electrically coupled to each other via the ground vias GV are laminated while the insulators that constitute the substrate 120 are interposed therebetween.

As illustrated in FIG. 5, the inner-layer wires 21 of the differential transmission lines 1 are provided in a wiring layer between the ground plane G3 and the ground plane G4 as an example, and the inner-layer wires 23 of the differential transmission lines 3 are provided in a wiring layer between the ground plane G2 and the ground plane G3 as an example. The inner-layer wires 23 are arranged so as to pass through a portion immediately above the inner-layer wires 21. Similarly, the inner-layer wires 22 of the differential transmission lines 2 are provided in the wiring layer between the ground plane G3 and the ground plane G4 as an example, and the inner-layer wires 24 of the differential transmission lines 4 are provided in the wiring layer between the ground plane G2 and the ground plane G3 as an example. The inner-layer wires 24 are arranged so as to pass through a portion immediately above the inner-layer wires 22.

In the wiring board 100 according to this embodiment, the differential transmission lines 1 to 4 are arranged side by side in the X direction and the Y direction, and hence the area of a region for arrangement of the surface-layer wires and the signal vias (region S surrounded by the broken line in FIG. 4) may be reduced as compared to the wiring board 100X illustrated in FIG. 2. Specifically, the area of the region S illustrated in FIG. 4 may be made smaller by about 25% than the area of the region Sx illustrated in FIG. 2.

Further, in the wiring board 100 according to this embodiment, the inner-layer wires 21 to 24 extend in the direction (X direction) intersecting the direction in which the surface-layer wires 11 to 14 extend (Y direction). Thus, when other inner-layer wires (for example, a wire for transmission of clock signals) to be used together with the differential transmission lines 1 to 4 are formed along the same direction as the direction in which the inner-layer wires 21 to 24 extend (X direction), the wires may be designed so that the above-mentioned other inner-layer wires pass through the region S. That is, it is possible to reduce the occurrence of a case in which the above-mentioned other inner-layer wires are inevitably arranged so as to bypass the region S.

Figure 6:
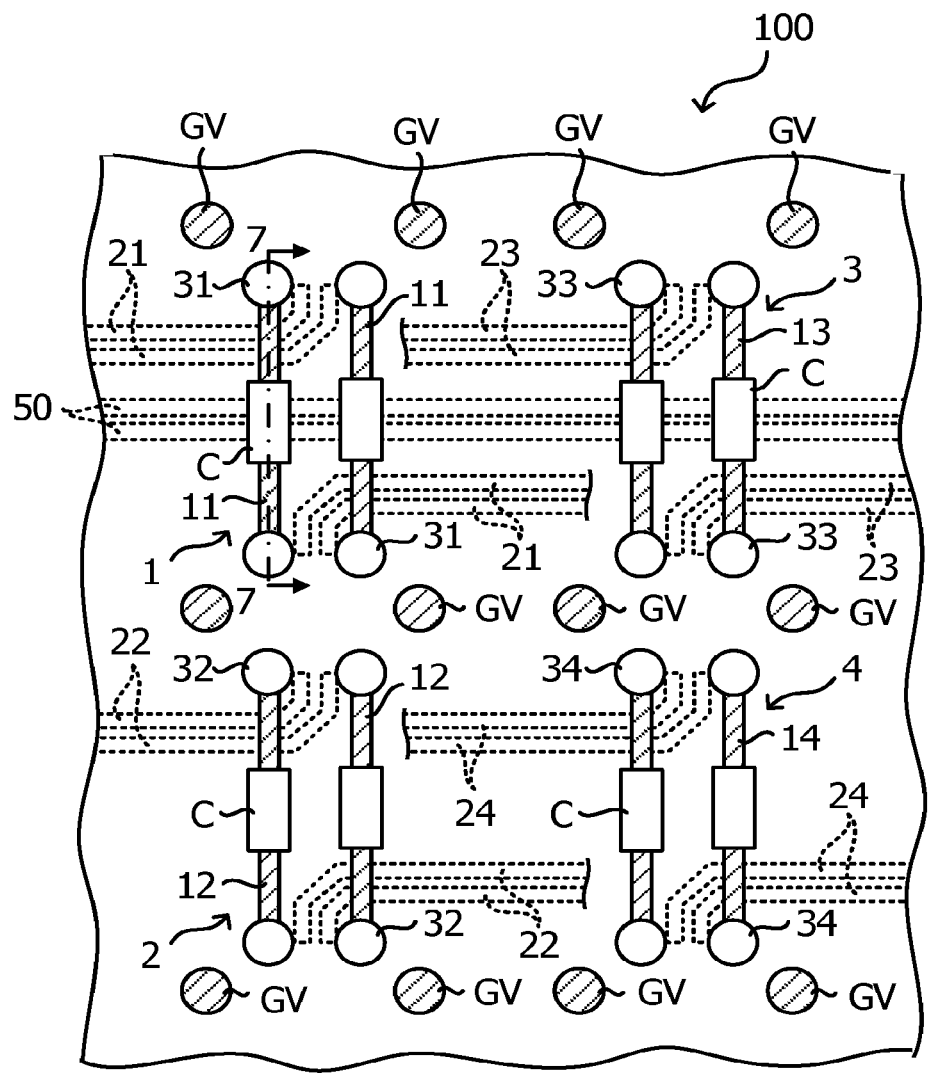
FIG. 6 is a plan view illustrating the configuration of the wiring board according to the embodiment of the disclosed technology.
Figure 6:
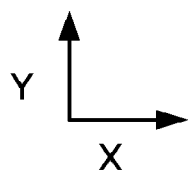

For example, as illustrated in FIG. 6, inner-layer wires 50 extending in the X direction, which are different from the inner-layer wires 21 to 24 that constitute the differential transmission lines 1 to 4, may be arranged so as to pass through a portion between the signal vias 31 provided at both ends of the surface-layer wires 11 and between the signal vias 33 provided at both ends of the surface-layer wires 13. That is, in this case, the inner-layer wires 50 pass through the lower side of the capacitors C coupled to the surface-layer wires 11 and 13, respectively. Note that the inner-layer wires 50 may be arranged so as to pass through the lower side of the capacitors C coupled to the surface-layer wires 12 and 14, respectively.

Figure 7:
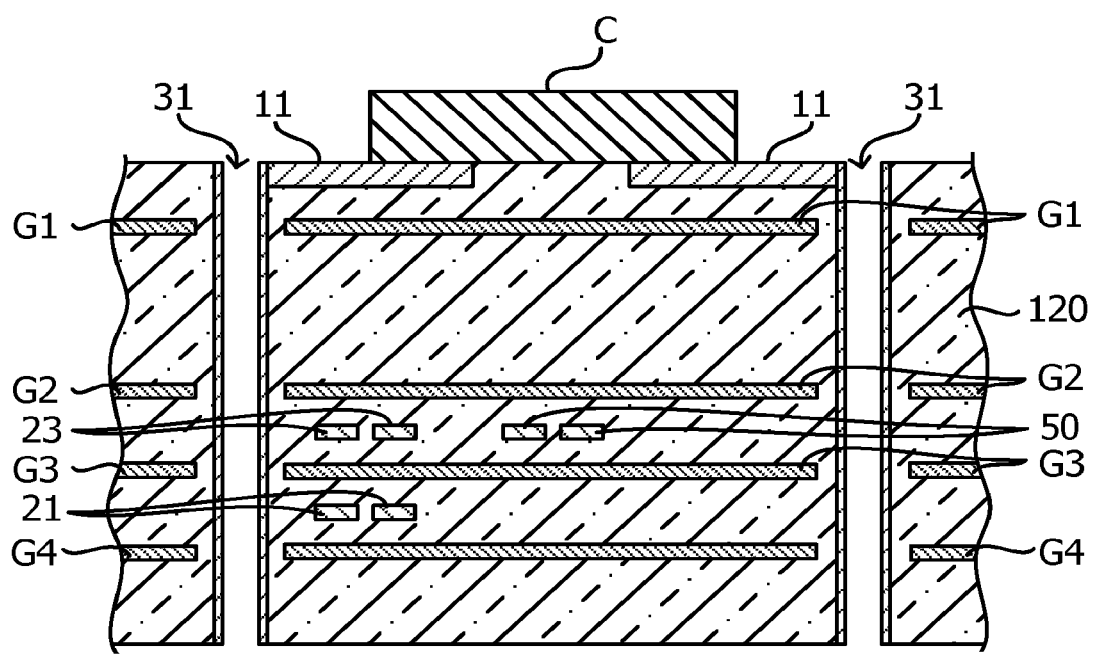
FIG. 7 is a sectional view taken along the line 7-7 in FIG. 6.

FIG. 7 is a sectional view taken along the line 7-7 in FIG. 6. As illustrated in FIG. 7, the inner-layer wires 50 may be arranged in, for example, the same wiring layer as that of the inner-layer wires 23 that constitute the differential transmission lines 3. Note that the layer in which the inner-layer wires 50 are arranged may be changed as appropriate.

As described above, with the wiring board 100 according to this embodiment, the degree of freedom of wire design may be secured while reducing the space for arrangement of the surface-layer wires and the signal vias.

Second Embodiment

Figure 8:
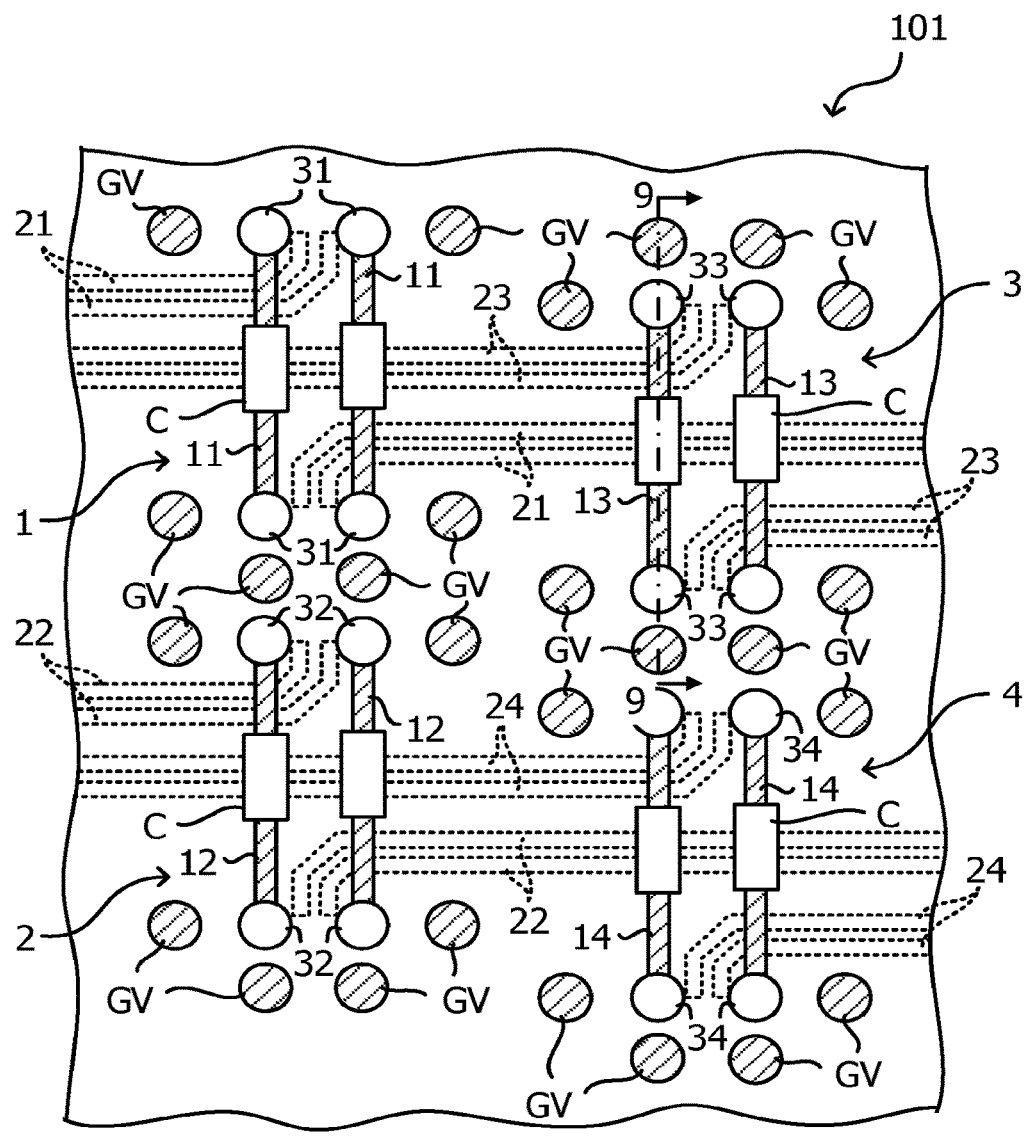
FIG. 8 is a plan view illustrating the configuration of a wiring board according to an embodiment of the disclosed technology.
Figure 8:
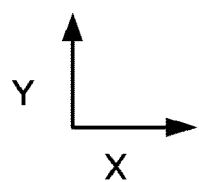
Figure 9:
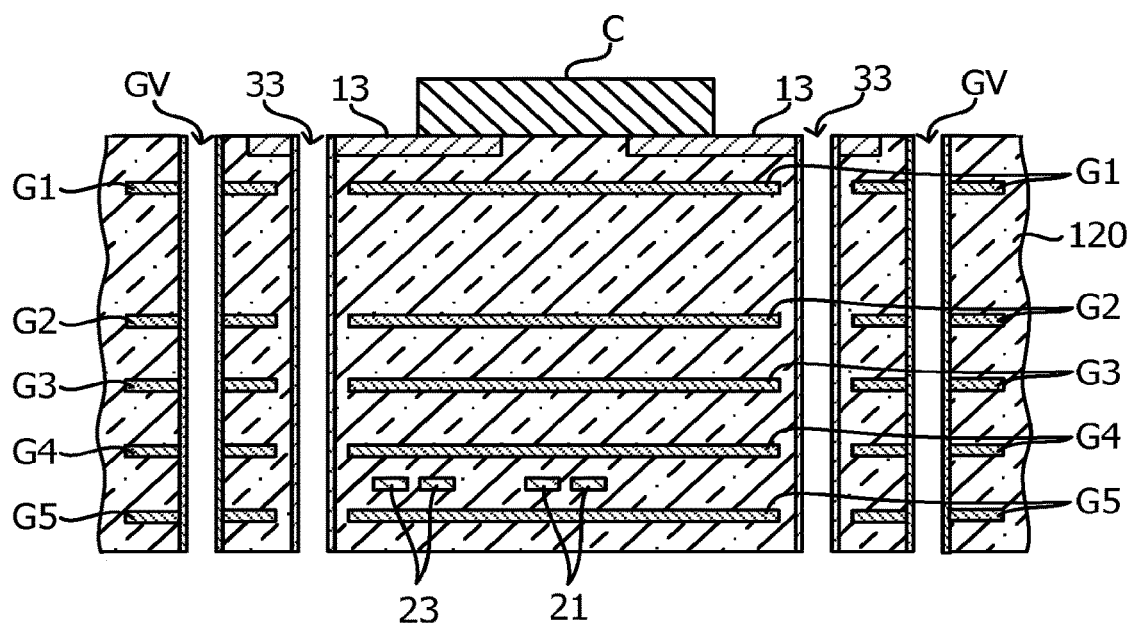
FIG. 9 is a sectional view taken along the line 9-9 in FIG. 8.

FIG. 8 is a plan view illustrating the configuration of a wiring board 101 according to a second embodiment of the disclosed technology. FIG. 9 is a sectional view taken along the line 9-9 in FIG. 8.

The wiring board 101 according to this embodiment is different from the wiring board 100 according to the first embodiment described above in that the differential transmission lines 3 and 4 are arranged while being shifted (offset or translated) in the Y direction from the differential transmission lines 1 and 2. Specifically, the differential transmission lines 3 are arranged while being offset downward in the Y direction from the differential transmission lines 1. In other words, the differential transmission lines 3 are arranged at positions corresponding to the positions where the differential transmission lines 3 are translated downward in the Y direction from the differential transmission lines 1. Thus, the respective signal vias 33 of the differential transmission lines 3 are arranged at positions corresponding to the positions where the signal vias 33 are translated downward in the Y direction from the corresponding signal vias 31 of the differential transmission lines 1. Similarly, the differential transmission lines 4 are arranged while being offset downward in the Y direction from the differential transmission lines 2. Thus, the respective signal vias 34 of the differential transmission lines 4 are arranged at positions corresponding to the positions where the signal vias 34 are translated downward in the Y direction from the corresponding signal vias 32 of the differential transmission lines 2.

As described above, the differential transmission lines 3 and 4 are arranged while being offset from the differential transmission lines 1 and 2, respectively, and hence the distance between the signal via 31 and the signal via 33 and the distance between the signal via 32 and the signal via 34 may be increased. Thus, crosstalk between the differential transmission lines 1 and 3 via the signal vias 31 and the signal vias 33 and crosstalk between the differential transmission lines 2 and 4 via the signal vias 32 and the signal vias 34 are suppressed.

Further, in the wiring board 101 according to this embodiment, the inner-layer wires 23 of the differential transmission lines 3 which extend toward the differential transmission lines 1 pass through a portion between the signal vias 31 provided at both ends of the surface-layer wires 11 of the differential transmission lines 1, that is, the lower side of the capacitors C provided on the surface-layer wires 11. On the other hand, the inner-layer wires 21 of the differential transmission lines 1 which extend toward the differential transmission lines 3 pass through a portion between the signal vias 33 provided at both ends of the surface-layer wires 13 of the differential transmission lines 3, that is, the lower side of the capacitors C provided on the surface-layer wires 13.

By arranging the differential transmission lines 3 while offsetting the differential transmission lines 3 from the differential transmission lines 1 as described above, a wire design in which the inner-layer wires 21 and the inner-layer wires 23 do not overlap each other is facilitated. Thus, as illustrated in FIG. 9, the inner-layer wires 21 and the inner-layer wires 23 may be arranged in the same wiring layer, and hence efficient wire arrangement may be achieved. In the example illustrated in FIG. 9, both the inner-layer wires 21 and the inner-layer wires 23 are provided in a wiring layer between ground planes G4 and G5.

Similarly, the inner-layer wires 24 of the differential transmission lines 4 which extend toward the differential transmission lines 2 pass through a portion between the signal vias 32 provided at both ends of the surface-layer wires 12 of the differential transmission lines 2, that is, the lower side of the capacitors C provided on the surface-layer wires 12. On the other hand, the inner-layer wires 22 of the differential transmission lines 2 which extend toward the differential transmission lines 4 pass through a portion between the signal vias 34 provided at both ends of the differential transmission lines 4, that is, the lower side of the capacitors C provided on the surface-layer wires 14. The inner-layer wires 22 and the inner-layer wires 24 may be arranged in the same wiring layer as that of the inner-layer wires 21 and the inner-layer wires 23. That is, with the wiring board 101 according to this embodiment, a wire design in which the inner-layer wires 21 to 24 are arranged in the same wiring layer is facilitated.

Further, as illustrated in FIG. 8, the ground vias GV are provided between the signal vias 31 and the signal vias 32 that adjoin each other in the Y direction and between the signal vias 33 and the signal vias 34 that adjoin each other in the Y direction, respectively. By providing the ground vias GV between the signal vias of the different differential transmission lines that adjoin each other as described above, crosstalk between the differential transmission lines via the signal vias is suppressed.

Figure 10:
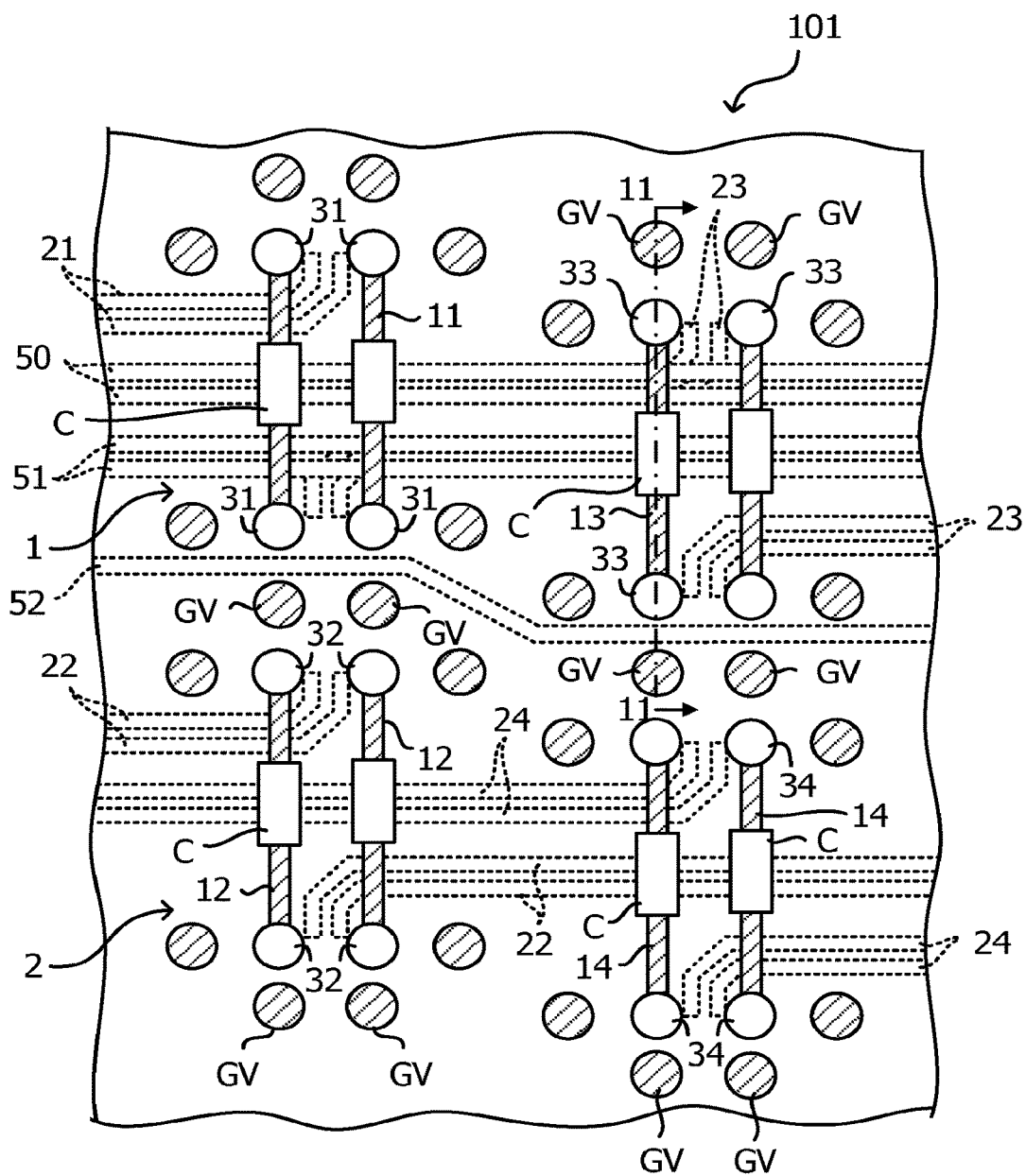
FIG. 10 is a plan view illustrating the configuration of the wiring board according to the embodiment of the disclosed technology.

With the wiring board 101 according to this embodiment, the space for arrangement of the surface-layer wires and the signal vias may be reduced similarly to the wiring board 100 according to the first embodiment. Further, for example, as illustrated in FIG. 10, inner-layer wires 50 and 51 extending in the X direction, which are different from the inner-layer wires 21 to 24 that constitute the differential transmission lines 1 to 4, may be arranged so as to pass through the lower side of the capacitors C coupled to the surface-layer wires 11 and 13, respectively. Moreover, an inner-layer wire 52 extending in the X direction, which is different from the inner-layer wires 21 to 24, may be arranged so as to pass through portions between the ground vias GV and the signal vias 31 and between the ground vias GV and the signal vias 33.

Figure 11:
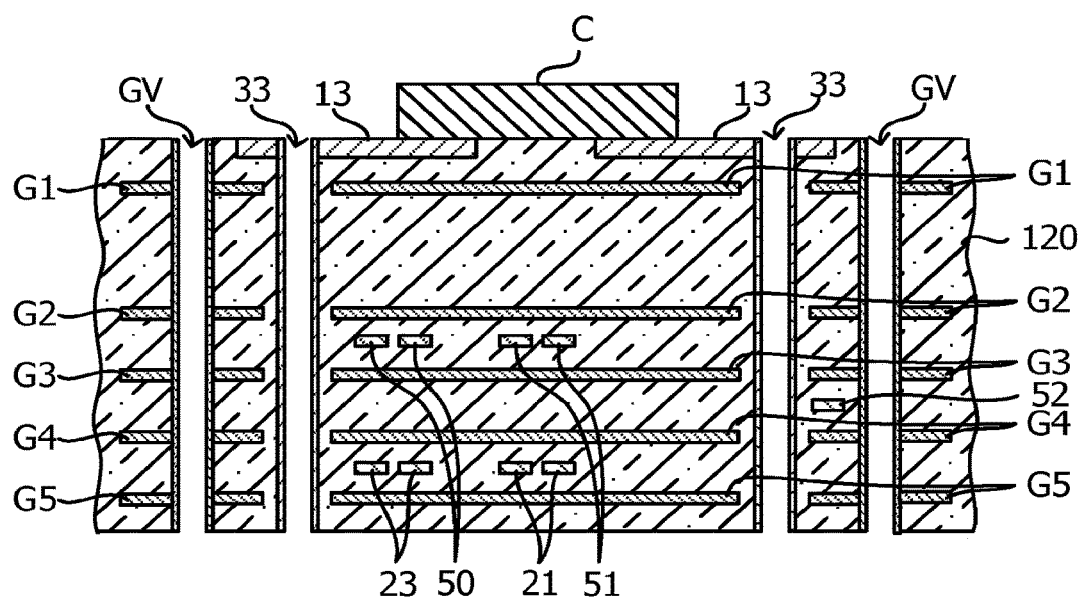
FIG. 11 is a sectional view taken along the line 11-11 in FIG. 10.

FIG. 11 is a sectional view taken along the line 11-11 in FIG. 10. As illustrated in FIG. 11, the inner-layer wires 50 are arranged in a wiring layer between the ground planes G2 and G3, and pass through a portion immediately above the inner-layer wires 23 as an example. Similarly to the inner-layer wires 50, the inner-layer wires 51 are arranged in the wiring layer between the ground planes G2 and G3, and pass through a portion immediately above the inner-layer wires 21 as an example. The inner-layer wire 52 is arranged in a wiring layer between the ground planes G3 and G4 as an example. Note that the wiring layers in which the inner-layer wires 50, 51, and 52 are arranged may be changed as appropriate.

Figure 12:
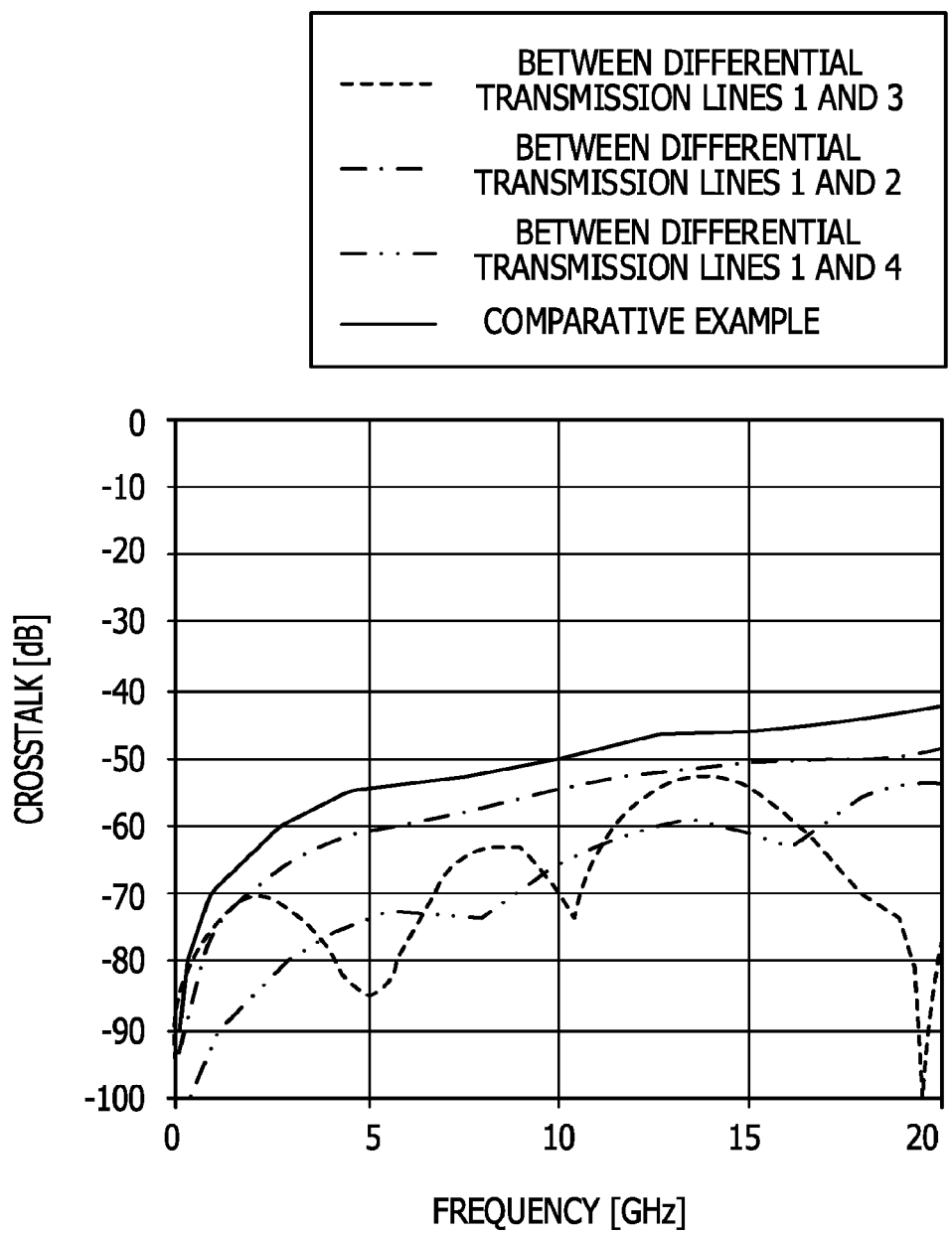
FIG. 12 is a graph illustrating results of calculation of crosstalk between the differential transmission lines in the wiring board.

In the wiring board 101 according to this embodiment, the differential transmission lines 1 to 4 are arranged with an offset and the ground vias GV are arranged between the signal vias as described above, and hence the crosstalk between the differential transmission lines 1 to 4 may be suppressed. Herein, FIG. 12 is a graph illustrating results of calculation of crosstalk between the differential transmission lines 1 and the other differential transmission lines 2 to 4 in the wiring board 101. FIG. 12 also illustrates a result of calculation of crosstalk between the differential transmission lines 1 and the differential transmission lines 2 in the wiring board 100X illustrated in FIG. 2 as a comparative example. As illustrated in FIG. 12, with the wiring board 101 according to this embodiment, the crosstalk may be reduced to about 50% or less as compared to the wiring board 100X according to the comparative example.

Third Embodiment

Figure 13:
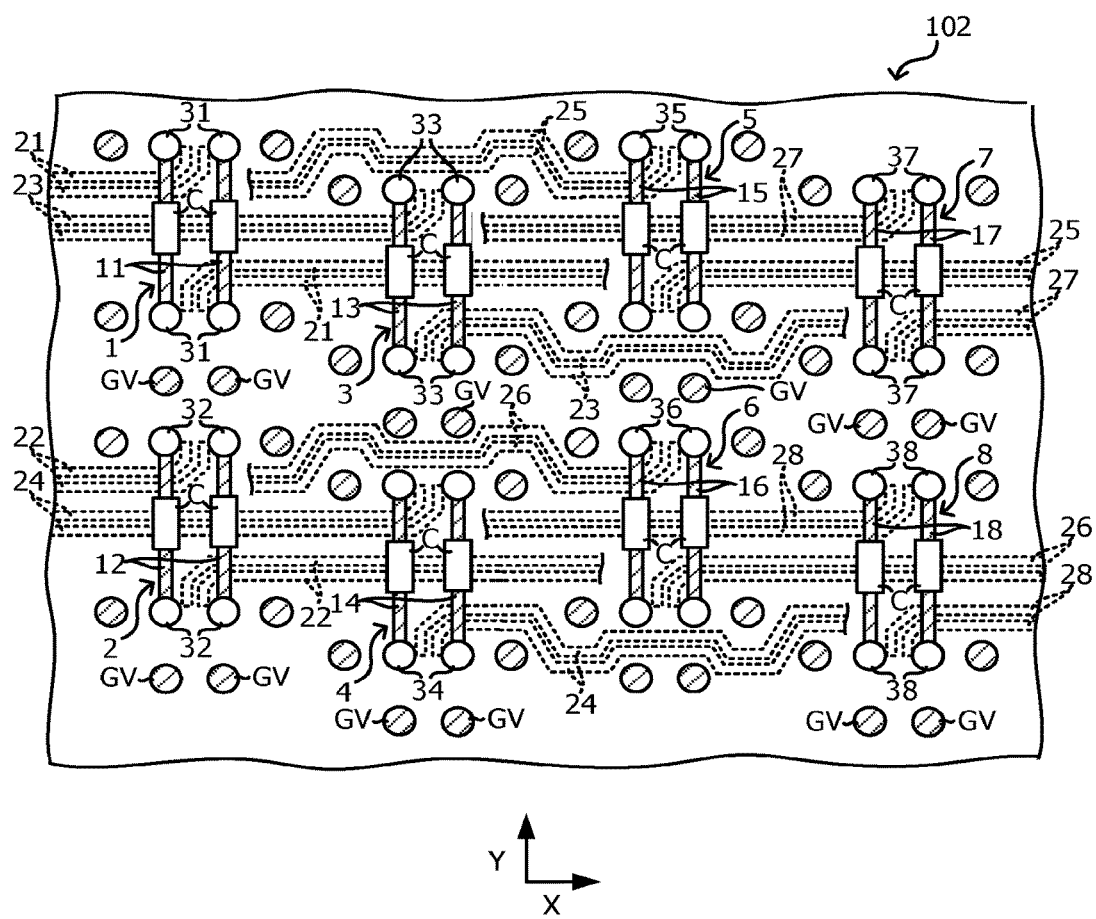
FIG. 13 is a plan view illustrating the configuration of a wiring board according to an embodiment of the disclosed technology.

FIG. 13 is a plan view illustrating the configuration of a wiring board 102 according to a third embodiment of the disclosed technology. The wiring board 102 according to this embodiment includes eight pairs of differential transmission lines 1 to 8. That is, in the wiring board 102 according to this embodiment, differential transmission lines 5 to 8 are added to the wiring board 101 according to the second embodiment. The differential transmission lines 5 to 8 have similar configurations to those of the differential transmission lines 1 to 4, and include pairs of surface-layer wires 15 to 18, pairs of inner-layer wires 25 to 28, and pluralities of signal vias 35 to 38, respectively. In the wiring board 102, the differential transmission lines 1 to 4 are arranged with an offset similarly to the wiring board 101 according to the second embodiment. The differential transmission lines 5 to 8 are also arranged with an offset similarly to the differential transmission lines 1 to 4. The surface-layer wires 11 to 18 each extend in the Y direction, and the inner-layer wires 21 to 28 each extend in the X direction.

The inner-layer wires 23 of the differential transmission lines 3 which extend toward the differential transmission lines 1 pass through a portion between the signal vias 31 provided at both ends of the surface-layer wires 11 of the differential transmission lines 1, that is, the lower side of the capacitors C provided on the surface-layer wires 11. On the other hand, the inner-layer wires 21 of the differential transmission lines 1 which extend toward the differential transmission lines 3 pass through portions between the signal vias 33, between the signal vias 35, and between the signal vias 37.

The inner-layer wires 24 of the differential transmission lines 4 which extend toward the differential transmission lines 2 pass through a portion between the signal vias 32 provided at both ends of the surface-layer wires 12 of the differential transmission lines 2, that is, the lower side of the capacitors C provided on the surface-layer wires 12. On the other hand, the inner-layer wires 22 of the differential transmission lines 2 which extend toward the differential transmission lines 4 pass through portions between the signal vias 34, between the signal vias 36, and between the signal vias 38. The inner-layer wires 21, 22, 23, and 24 are provided in the same wiring layer.

The inner-layer wires 27 of the differential transmission lines 7 which extend toward the differential transmission lines 5 pass through portions between the signal vias 35, between the signal vias 33, and between the signal vias 31. On the other hand, the inner-layer wires 25 of the differential transmission lines 5 which extend toward the differential transmission lines 7 pass through a portion between the signal vias 37 provided at both ends of the differential transmission lines 7, that is, the lower side of the capacitors C provided on the surface-layer wires 17.

The inner-layer wires 28 of the differential transmission lines 8 which extend toward the differential transmission lines 6 pass through portions between the signal vias 36, between the signal vias 34, and between the signal vias 32. On the other hand, the inner-layer wires 26 of the differential transmission lines 6 which extend toward the differential transmission lines 8 pass through a portion between the signal vias 38 provided at both ends of the differential transmission lines 8, that is, the lower side of the capacitors C provided on the surface-layer wires 18. The inner-layer wires 25, 26, 27, and 28 are provided in the same wiring layer which is different from the layer in which the inner-layer wires 21, 22, 23, and 24 are provided.

The inner-layer wires 25 are arranged so as to pass through a portion immediately above the inner-layer wires 21, and the inner-layer wires 26 are arranged so as to pass through a portion immediately above the inner-layer wires 22. The inner-layer wires 27 are arranged so as to pass through a portion immediately above the inner-layer wires 23, and the inner-layer wires 28 are arranged so as to pass through a portion immediately above the inner-layer wires 24.

With the wiring board 102 according to this embodiment, the degree of freedom of wire design may be secured while reducing the space for arrangement of the surface-layer wires and the signal vias similarly to the wiring boards according to the first embodiment and the second embodiment described above.

Fourth Embodiment

Figure 14:
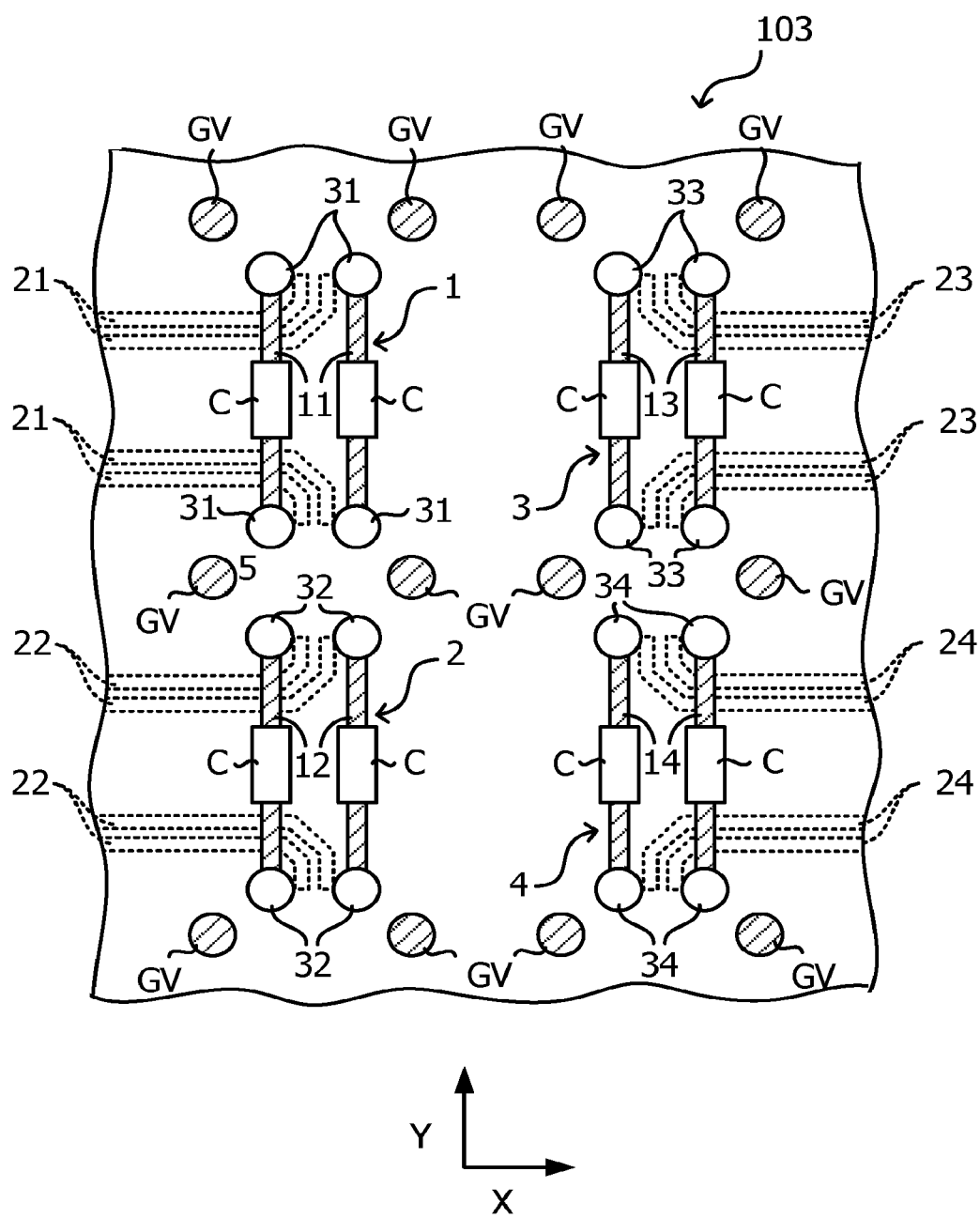
FIG. 14 is a plan view illustrating the configuration of a wiring board according to an embodiment of the disclosed technology.

FIG. 14 is a plan view illustrating the configuration of a wiring board 103 according to a fourth embodiment of the disclosed technology.

In the wiring boards 100 to 102 according to the first to third embodiments described above, the inner-layer wires coupled to the signal vias located at the upper ends of the surface-layer wires and the inner-layer wires coupled to the signal vias located at the lower ends of the surface-layer wires extend toward different sides in the X direction. For example, as illustrated in FIG. 4, the inner-layer wires 21 coupled to the signal vias 31 located at the upper ends of the surface-layer wires 11 extend leftward in the X direction, and the inner-layer wires 21 coupled to the signal vias 31 located at the lower ends of the surface-layer wires 11 extend rightward in the X direction. In contrast, in the wiring board 103 according to this embodiment, the inner-layer wires coupled to the signal vias located at the upper ends of the surface-layer wires and the inner-layer wires coupled to the signal vias located at the lower ends of the surface-layer wires extend toward the same sides in the X direction. For example, the inner-layer wires 21 coupled to the signal vias 31 located at the upper ends of the surface-layer wires 11 and the inner-layer wires 21 coupled to the signal vias 31 located at the lower ends of the surface-layer wires 11 extend leftward in the X direction in the example illustrated in FIG. 14. The same applies to the differential transmission lines 2, and the inner-layer wires 22 coupled to the signal vias 32 located at the upper ends of the surface-layer wires 12 and the inner-layer wires 22 coupled to the signal vias 32 located at the lower ends of the surface-layer wires 12 extend leftward in the X direction. In the differential transmission lines 3 and 4, the inner-layer wires 23 and 24 coupled to the signal vias 33 and 34 located at the upper ends of the surface-layer wires 13 and 14 and the inner-layer wires 23 and 24 coupled to the signal vias 33 and 34 located at the lower ends of the surface-layer wires 13 and 14 extend rightward in the X direction, respectively. The wiring board 103 is similar to the wiring board 100 according to the first embodiment described above except for the directions in which the inner-layer wires extend.

With the wiring board 103 according to this embodiment, the degree of freedom of wire design may be secured while reducing the space for arrangement of the surface-layer wires and the signal vias similarly to the wiring boards according to the first to third embodiments described above. Further, with the configuration in which the inner-layer wires are routed back to one side, it is possible to respond to a desire that the transmission circuit Tx (see FIG. 1) coupled to one end side of the inner-layer wires and the reception circuit Rx (see FIG. 1) coupled to the other end side of the inner-layer wires be arranged so as to adjoin each other on the wiring board 103.

Note that, in the wiring board 103 according to this embodiment, the differential transmission lines 1 to 4 may be arranged with an offset as in the case of the wiring board 101 according to the second embodiment described above. Further, the ground vias GV may be provided between the signal vias 31 and the signal vias 32 that adjoin each other in the Y direction and between the signal vias 33 and the signal vias 34 that adjoin each other in the Y direction, respectively.

Figure 15:
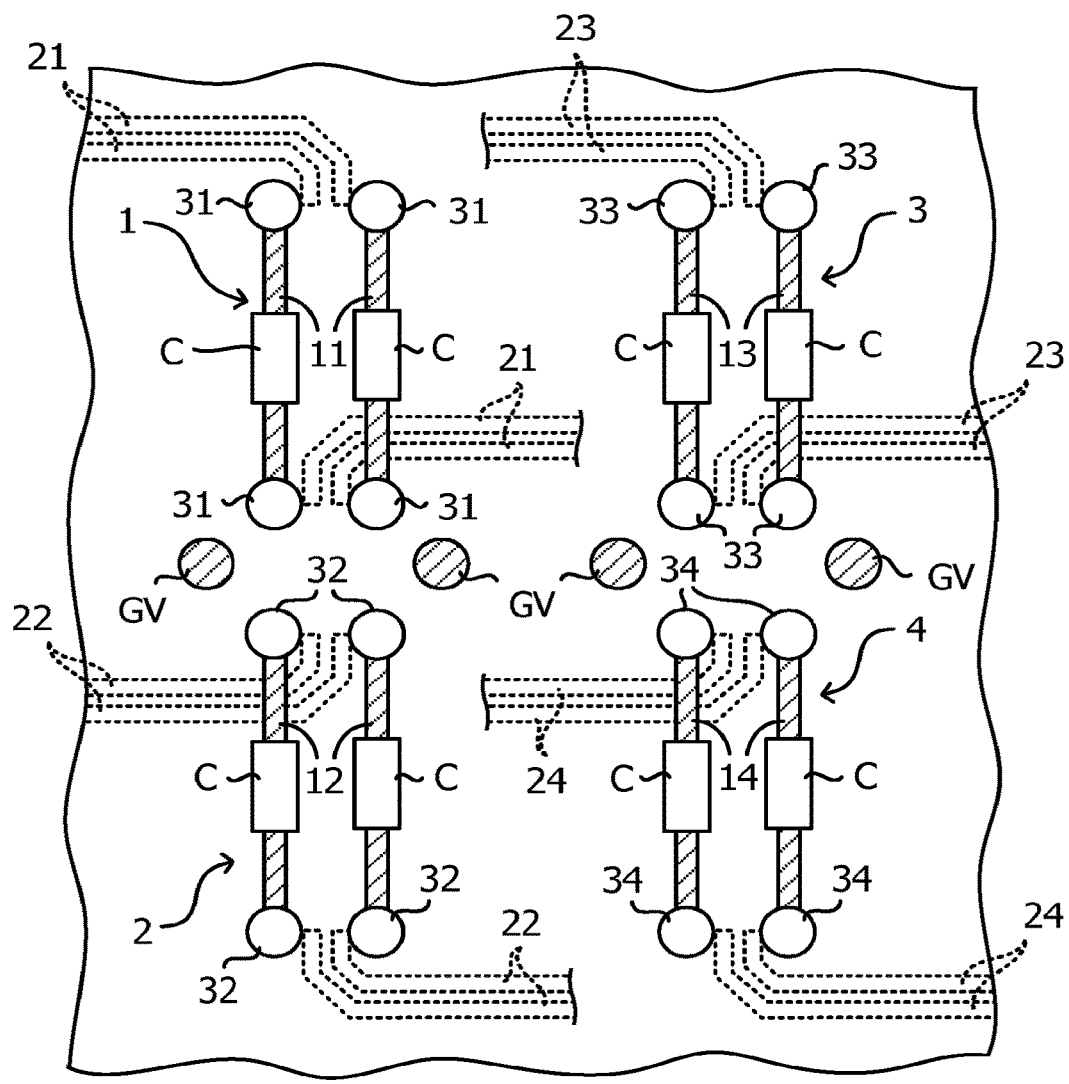
FIG. 15 is a plan view illustrating the configuration of a wiring board according to an embodiment of the disclosed technology.
Figure 15:
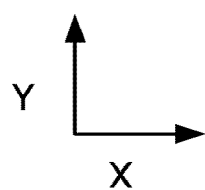

Note that, in the first to fourth embodiments described above, for example, the inner-layer wire is led out in the Y direction from the portion coupled to the signal via toward the center of the surface-layer wire (toward the capacitor C), and then bent in the X direction at 90° to extend away from the surface-layer wire while passing through the lower side of the surface-layer wire. However, the routing of the inner-layer wire may be modified as illustrated in, for example, FIG. 15. For example, the inner-layer wires 21 and 23 coupled to the signal vias 31 and 33 located at the upper ends may be led out in the Y direction from the portions coupled to the signal vias 31 and 33 toward the outer side of the surface-layer wires 11 and 13 (toward the upper side in FIG. 15), and then bent in the X direction at 90° to extend away from the surface-layer wires 11 and 13, respectively. Similarly, the inner-layer wires 22 and 24 coupled to the signal vias 32 and 34 located at the lower ends may be led out in the Y direction from the portions coupled to the signal vias 32 and 34 toward the outer side of the surface-layer wires 12 and 14 (toward the lower side in FIG. 15), and then bent in the X direction at 90° to extend away from the surface-layer wires 12 and 14, respectively.

Further, in the first to fourth embodiments described above, the wiring board including a pair of surface-layer wires and a pair of inner-layer wires that constitute differential transmission lines is exemplified, but the disclosed technology is also applicable to a wiring board including a single-end transmission line. That is, each transmission line formed on the wiring board may include a single surface-layer wire and a single inner-layer wire.

Note that the wiring boards 100 to 103 are examples of the wiring board of the disclosed technology. The substrate 120 is an example of the substrate of the disclosed technology. The surface-layer wires 11 to 14 are examples of the first to fourth surface-layer wires of the disclosed technology, respectively. The inner-layer wires 21 to 24 are examples of the first to fourth inner-layer wires of the disclosed technology, respectively. The signal vias 31 to 34 are examples of the first to fourth vias of the disclosed technology, respectively. The ground via GV is an example of the ground via of the disclosed technology.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
   a first wire, a second wire, a third wire and a fourth wire formed over a substrate and extending in a first direction respectively, the second wire being adjacent to the first wire in the first direction, and the third wire being adjacent to the first wire in a second direction orthogonal to the first direction, and the fourth wire being adjacent to the second wire in the second direction;
   a pair of fifth wires, a pair of sixth wires, a pair of seventh wires and a pair of eighth wires formed in the substrate and extending in the second direction respectively;
   a pair of ninth wires, a pair of tenth wires, a pair of eleventh wires and a pair of twelfth wires formed in the substrate and extending in a third direction orthogonal to a surface of the substrate respectively, wherein
   the pair of ninth wires couple a first end and a second end of the first wire to the pair of fifth wires, respectively, the pair of tenth wires couple a first end and a second end of the second wire to the pair of sixth wires, respectively, the pair of eleventh wires couple a first end and a second end of the third wire to the pair of seventh wires, respectively, and the pair of twelfth wires couple a first end and a second end of the fourth wire to the pair of eighth wires, respectively.

2. The wiring board according to claim 1, wherein the third wire is formed at a position where the first wire is shifted in the second direction, and the pair of eleventh wires is formed at a position where the pair of ninth wires is shifted in the second direction.

3. The wiring board according to claim 2, wherein
   the pair of fifth wires passes through a portion between the pair of eleventh wires, and
   the pair of seventh wires passes through a portion between the pair of ninth wires.

4. The wiring board according to claim 1, further comprising:
   a first ground wire formed between one of the pair of ninth wires and one of the pair of tenth wires.

5. The wiring board according to claim 1, wherein
   the substrate includes a plurality of insulating layers, and
   the pair of fifth wires, the pair of sixth wires, the pair of seventh wires, and the pair of eighth wires are formed on a first insulating layer included in the plurality of insulating layers.

6. The wiring board according to claim 1, further comprising:
   a thirteenth wire extending in the second direction in the substrate and passing through portions between the pair of ninth wires and between the pair of eleventh wires.

7. The wiring board according to claim 1, wherein
   the first wire and the second wire are a pair of wires constituting differential transmission lines, and
   the third wire and the fourth wire are a pair of wires constituting the differential transmission lines.

8. The wiring board according to claim 1, wherein electronic components are coupled to each of the first wire, the second wire, the third wire, and the fourth wire.

9. The wiring board according to claim 1, wherein each of the first wire, the second wire, the third wire, and the fourth wire includes:
   a first portion extending in the first direction from a coupling portion coupled to each of the pair of ninth wires, the pair of tenth wires, the pair of eleventh wires, and the pair of twelfth wires, and
   a second portion being bent from the first portion extending in the second direction.

10. The wiring board according to claim 4, wherein the pair of fifth wires, the pair of sixth wires, the pair of seventh wires, and the pair of eighth wires are formed at positions between a first ground plane and a second ground plane that are coupled to the first ground wire.

11. The wiring board according to claim 1, wherein each of the pair of twelfth wires is provided at a position where each of the pair of tenth wires is shifted in the first direction.

12. The wiring board according to claim 1, wherein
   the pair of sixth wires passes through a portion between the pair of twelfth wires, and
   the pair of eighth wires passes through a portion between the pair of tenth wires.

13. The wiring board according to claim 1, further comprising:
   a second ground wire, which is provided between one of the pair of tenth wires and one of the pair of twelfth wires.

14. The wiring board according to claim 1, wherein
   the pair of ninth wires, the pair of tenth wires, the pair of eleventh wires and the pair of twelfth wires are signal vias.

15. The wiring board according to claim 1, further comprising:
- a first conductive layer formed on the first wire;
- a second conductive layer formed on the second wire;
- a third conductive layer formed on the third wire; and
- a fourth conductive layer formed on the fourth wire, wherein
- the pair of fifth wires and the pair of seventh wires are a first signal transmission line configured to transmit a first signal,
- the pair of sixth wires and the pair of eighth wires are a second signal transmission line configured to transmit a second signal,
- the first conductive layer and the third conductive layer form a first capacitor that is provided on the first signal transmission line and is configured to remove a direct-current component of the first signal, and
- the second conductive layer and the fourth conductive layer form a second capacitor that is provided on the second signal transmission line and is configured to remove a direct-current component of the second signal.

16. An electronic device, comprising:
a wiring board;
a differential signal transmission circuit formed over the wiring board and being configured to output a pair of differential signals; and
a differential signal reception circuit formed over the wiring board and being configured to receive the pair of the differential signals, wherein
the wiring board includes:
- a first wire, a second wire, a third wire and a fourth wire formed over a substrate and extending in a first direction respectively, the second wire being adjacent to the first wire in the first direction, and the third wire being adjacent to the first wire in a second direction orthogonal to the first direction, and the fourth wire being adjacent to the second wire in the second direction,
- a pair of fifth wires, a pair of sixth wires, a pair of seventh wires and a pair of eighth wires formed in the substrate and extending in the second direction respectively,
- a pair of ninth wires, a pair of tenth wires, a pair of eleventh wires and a pair of twelfth wires formed in the substrate and extending in a third direction orthogonal to a surface of the substrate respectively, the pair of ninth wires coupling a first end and a second end of the first wire to the pair of fifth wires, respectively, the pair of tenth wires coupling a first end and a second end of the second wire to the pair of sixth wires, respectively, the pair of eleventh wires coupling a first end and a second end of the third wire to the pair of seventh wires, respectively, and the pair of twelfth wires coupling a first end and a second end of the fourth wire to the pair of eighth wires, respectively, and
- a first conductive layer, a second conductive layer, a third conductive layer and a fourth conductive layer formed on the first wire, on the second wire, on the third wire, and on the fourth wire, respectively,
the pair of fifth wires and the pair of seventh wires are a first signal transmission line configured to transmit a first signal that is one of the pair of differential signals,
the pair of sixth wires and the pair of eighth wires are a second signal transmission line configured to transmit a second signal that is another one of the pair of differential signals,
the first conductive layer and the third conductive layer form a first capacitor formed on the first signal transmission line and configured to remove a direct-current component of the first signal, and
the second conductive layer and the fourth conductive layer form a second capacitor formed on the second signal transmission line and configured to remove a direct-current component of the second signal.

17. The electronic device according to claim 16, wherein the third wire is formed at a position where the first wire is shifted in the second direction, and the pair of eleventh wires is formed at a position where the pair of ninth wires is shifted in the second direction.

18. The electronic device according to claim 17, wherein
the pair of fifth wires passes through a portion between the pair of eleventh wires, and
the pair of seventh wires passes through a portion between the pair of ninth wires.

19. The electronic device according to claim 16, further comprising:
a first ground wire formed between one of the pair of ninth wires and one of the pair of tenth wires.

20. The electronic device according to claim 16, wherein the substrate includes a plurality of insulating layers, and
the pair of fifth wires, the pair of sixth wires, the pair of seventh wires, and the pair of eighth wires are formed on a first insulating layer included in the plurality of insulating layers.

* * * * *